US005485109A

United States Patent [19]

Dobkin et al.

[11] Patent Number: 5,485,109

[45] Date of Patent: Jan. 16, 1996

[54] ERROR SIGNAL GENERATION CIRCUIT FOR LOW DROPOUT REGULATORS

[75] Inventors: Robert C. Dobkin, Monte Sereno; Carl T. Nelson, San Jose; Dennis P. O'Neill, San Carlos, all of Calif.

[73] Assignee: Linear Technology Corporation, Milpitas, Calif.

[21] Appl. No.: 241,505

[22] Filed: May 12, 1994

Related U.S. Application Data

[60] Continuation of Ser. No. 98,461, Jul. 27, 1993, Pat. No. 5,334,928, which is a division of Ser. No. 785,483, Oct. 31, 1991, Pat. No. 5,274,323.

[51] Int. Cl.$^6$ .................................................... H03K 5/153

[52] U.S. Cl. ............................ 327/77; 327/539; 323/280

[58] Field of Search ................................ 327/77, 80, 81, 327/82, 83, 84, 85, 86, 87, 88, 89, 530, 531, 534, 535, 537, 538, 539

[56] References Cited

U.S. PATENT DOCUMENTS

| | | | |
|---|---|---|---|
| 3,675,159 | 4/1972 | Judd et al. . | |
| 4,543,522 | 9/1985 | Moreau | 323/303 |
| 4,613,809 | 9/1986 | Skovmand | 323/268 |
| 4,706,012 | 11/1987 | Kerkman et al. | 323/280 |
| 4,779,037 | 10/1988 | LoCascio | 323/275 |
| 4,792,745 | 12/1988 | Dobkin et al. | 323/269 |
| 4,792,747 | 12/1988 | Schroeder | 323/303 |
| 4,851,953 | 7/1989 | O'Neill et al. | 323/277 |
| 4,906,913 | 3/1990 | Stanojevic | 323/303 |
| 4,926,109 | 5/1990 | Koterasawa | 323/274 |
| 4,928,056 | 5/1990 | Pease | 323/314 |
| 5,036,269 | 7/1991 | Murari et al. | 323/266 |
| 5,041,777 | 8/1991 | Riedger | 323/277 |
| 5,105,145 | 4/1992 | Neth | 323/316 |
| 5,168,209 | 12/1992 | Theil | 323/313 |
| 5,182,526 | 1/1993 | Nelson | 323/257 |
| 5,274,323 | 12/1993 | Dobkin et al. | 323/280 |

*Primary Examiner*—Timothy P. Callahan
*Assistant Examiner*—Jeffrey Zweizig
*Attorney, Agent, or Firm*—Fish & Neave; Mark D. Rowland

[57] ABSTRACT

A three terminal control circuit for a low dropout voltage regulator having a PNP pass transistor is provided. The control circuit is capable of pulling the base-drive point down to a voltage of 3.0 volts or less to permit a current limiting resistor to be inserted between the base drive point and the base of the PNP pass transistor. The control circuit includes a pair of small-valued capacitors for providing stable operation with different output capacitors. The control circuit can also be used with p-channel FET pass transistors.

9 Claims, 3 Drawing Sheets

ERROR SIGNAL GENERATION CIRCUIT FOR LOW DROPOUT REGULATORS

This is a continuation of application Ser. No. 08/098,461, now U.S. Pat. No. 5,334,928, filed Jul. 27, 1993 entitled FREQUENCY COMPENSATION CIRCUIT FOR LOW DROPOUT REGULATOR which is a divisional of application Ser. No. 07/785,483 filed Oct. 31, 1991 entitled CONTROL CIRCUIT FOR LOW DROPOUT REGULATOR, now U.S. Pat. No. 5,274,323.

BACKGROUND OF THE INVENTION

The present invention relates to a control circuit for providing low dropout voltage regulation in a series voltage regulator circuit. More particularly, the present invention relates to a three terminal control circuit for driving a discrete PNP transistor or p-channel FET to provide a low dropout positive series voltage regulator circuit.

A series voltage regulator circuit requires a minimum voltage differential between the supply voltage and the regulated output voltage in order to provide proper regulation. This minimum voltage differential is known as the dropout voltage of the regulator circuit. A voltage regulator circuit having a low dropout voltage has many useful applications.

Three terminal integrated circuit (IC) control devices for PNP regulators are usually designed with the intention that the base drive terminal be connected directly to the base of the discrete PNP transistor. This maximizes the voltage available for powering circuitry in the device which must use the base drive terminal as a power supply. Accordingly, the circuits generally are not designed to pull the voltage of the base drive terminal more than one volt below the regulator input voltage.

In some regulator applications, it may be desirable to use an FET as the pass transistor. However, such applications may require that the gate voltage of the FET be pulled down close to ground (e.g. to create a gate-source voltage differential of several volts). Conventional regulator control circuits are not designed to operate in this manner, as discussed above.

With a three terminal IC control circuit design (for a PNP regulator), the output current and input voltage of the regulator cannot be sensed for purposes of current limiting. This is because either type of sensing would require additional terminals. Thus, the current limit point of the IC's internal base drive current limit circuitry must be set based on the anticipated current gain of the discrete transistor, and the anticipated regulator output current, to avoid regulator operating conditions exceeding the current and power handling limits of the discrete PNP transistor.

However, protection becomes unpredictable if the user chooses a discrete PNP transistor having different current gain and power handling characteristics than those anticipated by the manufacturer. For example, the user may select a PNP transistor that cannot be safely operated at the maximum base drive current allowed by the internal current limit circuitry of the control circuit.

A similar problem arises with respect to frequency compensation. An IC regulator control circuit may be used in various application circuits having output capacitors of widely different capacitance and effective series resistance (ESR) values. However, the frequency compensation circuitry of conventional IC regulator control circuits generally provides stability only for a limited range of output capacitors.

Accordingly, it would be desirable robe able to provide a three terminal voltage regulator control circuit which could be used in a low dropout regulator circuit design in which current limiting could be adjusted for different PNP pass transistors and different applications. It would further be desirable if the control circuit could tolerate a wide range of output capacitors, and if the control circuit could provide several volts of gate-source drive voltage for an FET pass transistor in a low voltage circuit.

SUMMARY OF THE INVENTION

It is therefore an object of this invention to provide a three terminal control circuit for driving a PNP pass transistor in a regulator circuit having a low dropout voltage and controllable current limiting.

It is another object of this invention to provide a frequency compensation circuit that can be incorporated in a regulator control circuit to provide stability in conjunction with different sized regulator circuit output capacitors.

It is yet another object of this invention to provide a three terminal regulator control circuit that can drive a p-channel FET pass transistor in a circuit where the source voltage is limited to a low input voltage.

These and other objects are accomplished by a control circuit that can be implemented in an integrated circuit package having three terminals: a base drive terminal, a feedback terminal and a ground terminal. The control circuit is designed to saturate at a base drive terminal voltage of less than three volts, preferably going as low as 1.1 volts under some low current conditions, such that a resistor can be inserted between the base drive terminal and the PNP transistor base to limit regulator output current and to limit power dissipation in the control circuit, and such that a p-channel FET can be used as the pass transistor.

The control circuit also includes a frequency compensation circuit that can be implemented without a large value internal capacitor, and that provides stability in regulator circuits having different output capacitors.

BRIEF DESCRIPTION OF THE DRAWING

The above and other objects and advantages of the present invention will be apparent upon consideration of the following detailed description, taken in conjunction with the accompanying drawings, in which like reference characters are provided to like characters throughout, and in which.

DETAILED DESCRIPTION OF THE INVENTION

Figure 1:
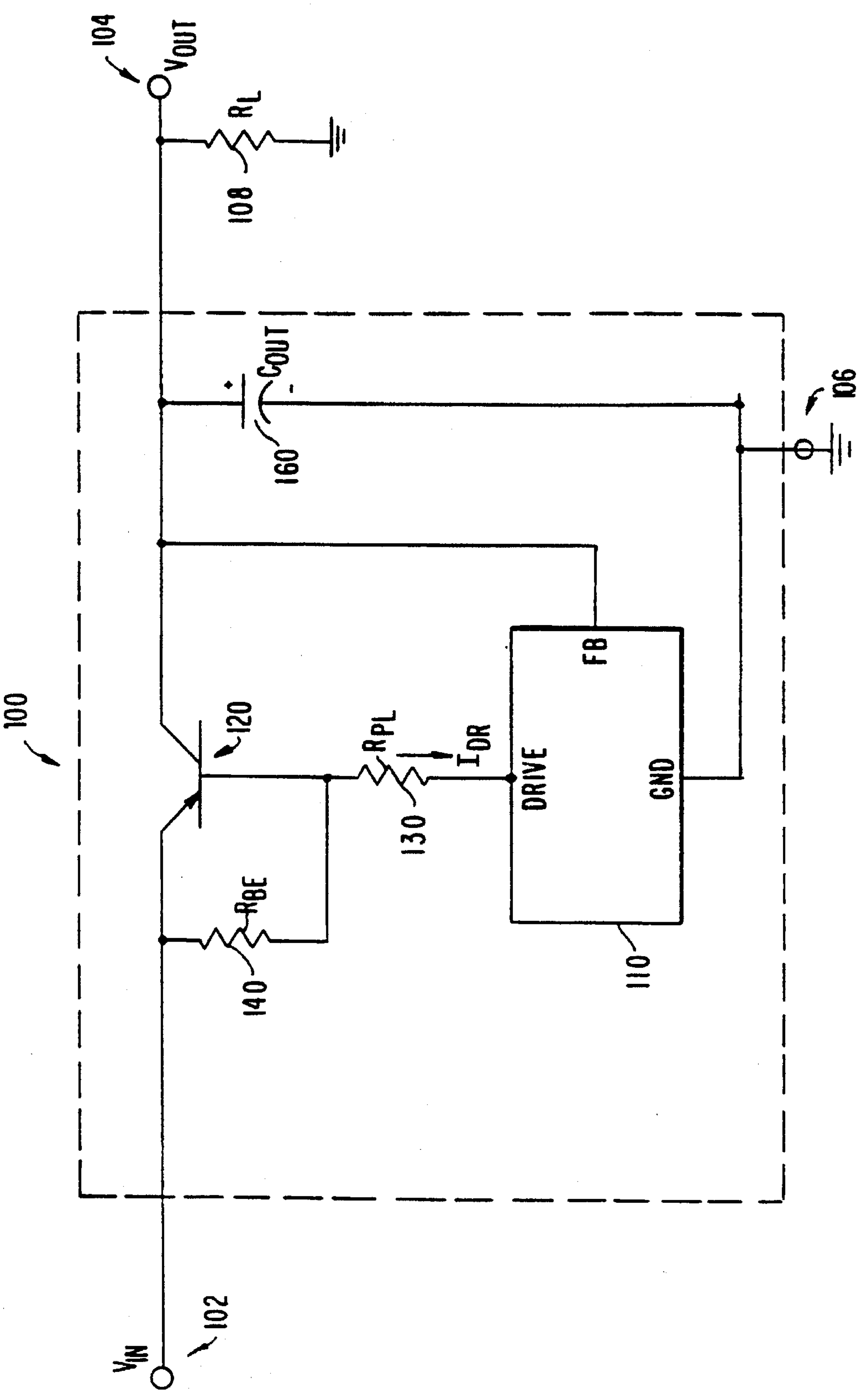
FIG. 1 shows a schematic diagram of an application circuit for a control circuit designed in accordance with the principles of the present invention.

FIG. 1 illustrates an exemplary application circuit 100 for a voltage regulator control circuit of the type contemplated for the present invention. Application circuit 100 is configured as a positive series voltage regulator circuit. When an unregulated positive input voltage $V_{IN}$ is applied to voltage input node 102 (positive with respect to the voltage at ground node 106), voltage regulator circuit 100 provides a regulated positive output voltage $V_{OUT}$ (also positive with respect to the voltage at ground node 106) to a load connected to voltage output node 104. In FIG. 1, a simple resistive load $R_L$ is represented by resistor 108.

Control circuit 110, which is preferably a monolithic integrated circuit device, has three terminals labeled as DRIVE (base drive), FB (feedback) and GND (ground). In FIG. 1, control circuit 110 together with a discrete PNP transistor 120, a current limiting resistor 130, a pull-up resistor 140 and an output capacitor 160, form voltage regulator circuit 100. Control circuit 110 regulates the output voltage $V_{OUT}$ which it senses at its feedback terminal FB, by controlling the base current of PNP transistor 120 to maintain the voltage at terminal FB of the control circuit at a predetermined voltage. With the exception of current limiting resistor 130, the configuration of voltage regulator circuit 100 is conventional.

Current limiting resistor 130, which is optional, provides a controlled limit on the base drive current of PNP transistor 120 that can be adjusted for different input voltages and different PNP transistors. The value of resistor 130 can be selected to provide a desired current limit value for a given input voltage. For example, assume that output voltage $V_{OUT}$ suddenly falls below the value at which it is being regulated by regulator circuit 100 due to an overload condition. Control circuit 110 will attempt to turn PNP transistor 120 on hard by sinking a large base drive current $I_{DR}$ at its DRIVE terminal. This current will generate a voltage across resistor 130. As the base drive current increases, a point will be reached at which the voltage across resistor 130 drives control circuit 110 into saturation. The base drive current will be limited by the saturation of the control circuit.

Assuming the saturation voltage of control circuit 110 and the forward base-emitter voltage drop of PNP transistor 120 sum to approximately 2.0 volts, a value of current limiting resistor 130 can easily be chosen to provide a desired base drive current $I_{DR}$ by the following formula: $R_{FL}=(V_{MIN}-2.0\ V)/I_{DR}$, where $V_{MIN}$ is the minimum expected input voltage.

Conventional regulator control circuits are designed with the intention that the DRIVE terminal operate at a voltage within approximately one volt of the regulator input voltage. Such designs generally do not permit a current limiting resistor, other than perhaps a very small value resistor, to be used as shown in FIG. 1 without substantially increasing the dropout voltage of the regulator.

Applicants have conceived of a design for the circuitry of control circuit 110 that permits the DRIVE terminal to saturate at voltages as low as approximately 1.1 volts above ground. This allows a wide range of current limiting resistors (e.g. 20–110 ohms) to be inserted between the DRIVE terminal and the base of the PNP transistor while maintaining a low dropout voltage. Although applicants prefer such a low saturation voltage, applicants believe that effective current limiting (i.e. current limiting that avoids catastrophic PNP transistor damage under high input voltage and short circuit output conditions) can be achieved-with somewhat higher saturation voltages. For example, applicants contemplate that current limiting in accordance with the principles of the present invention could be accomplished in a 5 volt regulator with a control circuit having a saturation voltage as high as 3 volts.

In another aspect, the present invention features a frequency compensation circuit that can be implemented in the control circuit to provide stability when the control circuit is used with different output capacitors. This is accomplished by providing a combination feedback and feedforward scheme involving a pair of small-valued capacitors that cause the regulator loop gain to roll off to a point well below 0 dB before flattening out at higher frequencies. The circuit thus allows sufficient phase and gain margin to tolerate a wide range of output capacitors.

Figure 2:
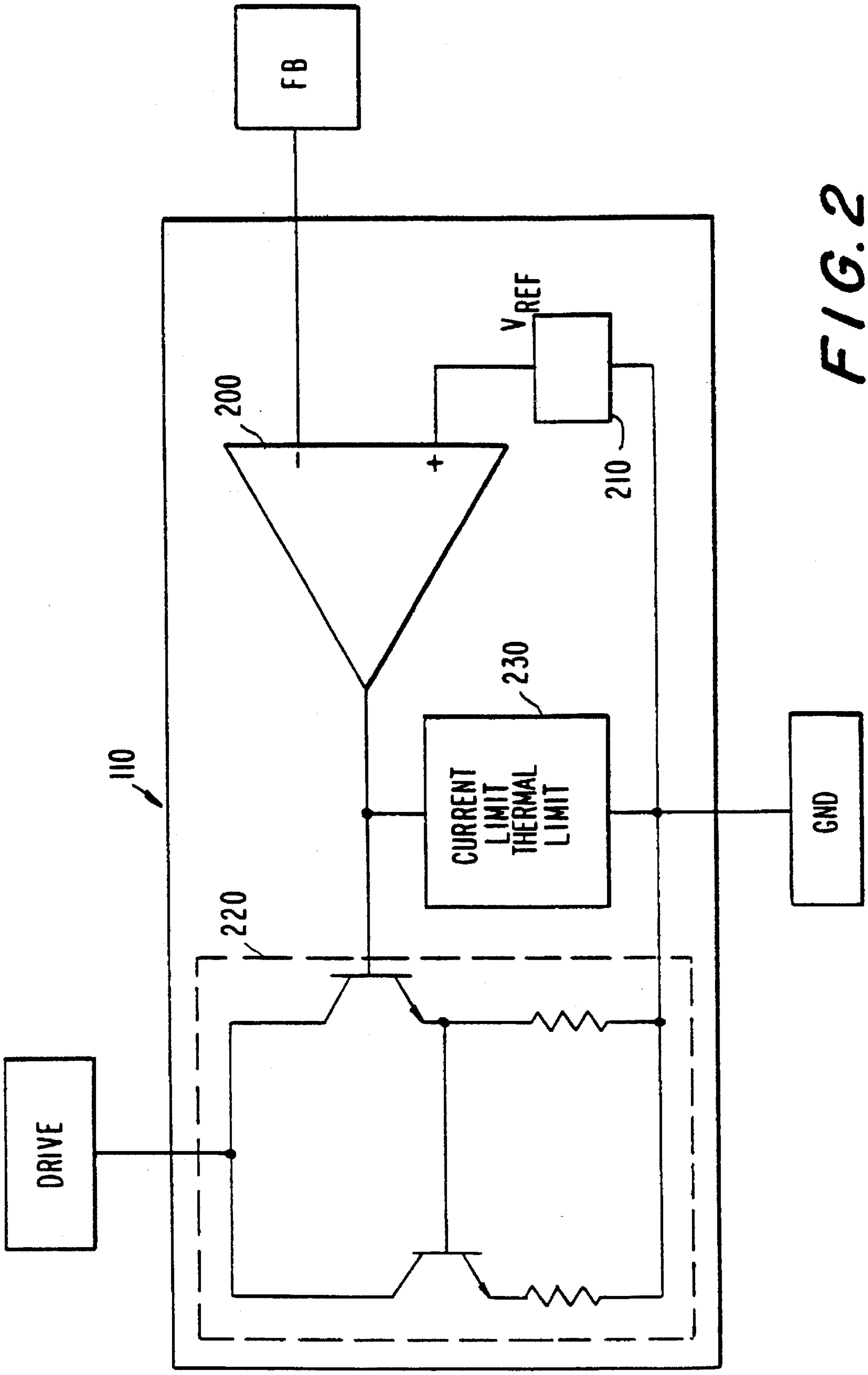
FIG. 2 shows a simplified block diagram of an embodiment of the control circuit of the present invention.

FIG. 2 illustrates, in block diagram form, an exemplary control circuit architecture suitable for incorporating the present invention in control circuit 110. Control circuit 110 includes an error amplifier circuit 200 having an inverting input connected to the feedback terminal FB, and a non-inverting input connected to a voltage reference circuit 210. Error amplifier circuit 200 compares the voltage of terminal FB with a fixed voltage generated by reference circuit 210, and provides an error signal to driver circuit 220. This error signal controls driver circuit 220, which, responsive to the error signal, conducts base drive current between the DRIVE and GND terminals of control circuit 110. Control circuit 110 also includes an internal base drive current limit circuit 230 that limits the current conducted by driver circuit 220 to a predetermined value, and that turns off driver circuit 220 if the operating temperature of control circuit 110 exceeds a threshold temperature.

Figure 3:
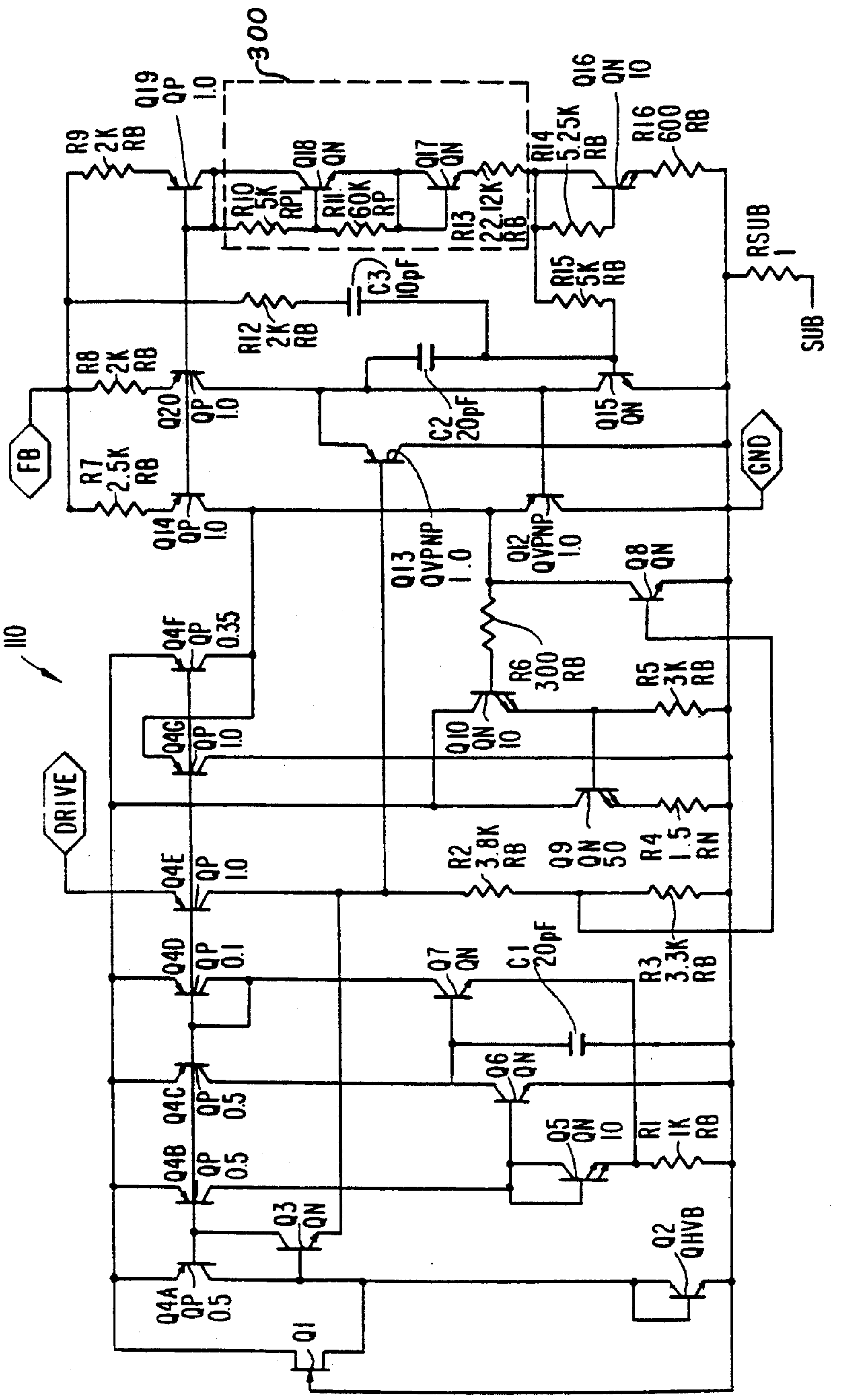
FIG. 3 shows a schematic diagram of a preferred circuit embodiment of the control circuit of the present invention.

FIG. 3 illustrates a preferred circuit embodiment for implementing the control circuit 110 of the present invention in an integrated circuit device having the general architecture of FIG. 2. This particular embodiment is designed to provide a regulated output voltage of approximately 5 volts. The circuit generally comprises three sections: a start-up section, a bias section, and a control section.

The purpose of the start-up section is to start control circuit 110 working when a voltage differential first appears across the DRIVE and GND terminals. The start-up section includes transistors Q1, Q2, Q3 and Q4A on the left hand side of FIG. 3. Transistor Q1 is a JFET produced by epitaxial growth and serves the purpose of providing current to diode-connected transistor Q2 when a voltage differential appears across the DRIVE and GND terminals. Transistor Q2 is fabricated to have a high turn-on voltage ($V_{BE}$ approximately 850 mV at 25 degrees Celsius). With a small current flowing through transistor Q2, transistor Q3 then turns on and subsequently sends current through resistors R2 and R3 while simultaneously drawing current from the common base node of transistors Q4A–G. This causes transistors Q4A–F, all of which have their base-emitter circuits connected in parallel, to turn on. The turning on of transistor Q4E causes additional current flow through resistors R2 and R3. This additional current increases the voltage at the emitter of transistor Q3 (i.e., across resistors R2 and R3) so as to eventually reverse bias the base-emitter junction of Q3 and therefore shut off the start-up circuit from the rest of the circuit after the Q4A–F transistors-have been turned on. Once control circuit 110 is operating, the components in the start-up section are of no consequence.

Moving further to the right of FIG. 3, transistors Q5, Q6 and Q7 form the bias section. These transistors bias the PNP transistor string Q4A–G to provide substantially constant current from all the PNP collectors even with changing output/drive voltage. This substantially constant current is also used to generate a substantially constant reference voltage across resistors R2 and R3.

The bias section can operate down to approximately one volt. Transistors Q5 and Q6, which are connected in a current mirror configuration, have unequal emitter areas in a ratio of 10:1, causing a d($V_{BE}$ voltage of approximately 60 mV to appear across resistor R1 when transistors Q5 and Q6 conduct equal currents. This voltage, which sets the current in the bias transistors Q4B–F, has a positive temperature coefficient. Transistor Q7 is connected to provide a feedback loop. This feedback loop ensures a substantially constant current with changing voltage at the DRIVE terminal. Capacitor C1 is provided as frequency compensation for the feedback loop.

The control section of control circuit 110 is of a bandgap-reference type and comprises a combined reference voltage generator and error amplifier circuit (corresponding to blocks 200 and 210 of FIG. 2) which drives a current gain stage (corresponding to driver circuit block 220 of FIG. 2). More particularly, transistors Q15–20 on the right hand side of FIG. 3 form the active components of the bandgap circuit. The output of this bandgap-type circuit drives current gain stage transistors Q12, Q9 and Q10, which in turn drive the base drive point (the DRIVE terminal) of the control circuit.

The bandgap circuit of FIG. 3 is powered by current drawn from the feedback terminal (FB) of control circuit 110. As is well-known, and will therefore only be briefly discussed here, a bandgap circuit works by balancing positive and negative temperature coefficients to provide a temperature-stable reference voltage. In the circuit of FIG. 3, when voltage is applied to the FB terminal, current flows through the transistor/resistor string R9, Q19 (diode-connected), Q18 (and its associated bias resistor R10 and R11), Q17 (diode-connected), R13, Q16 and R15. By virtue of the current mirror configuration of transistors Q19 and Q20, an equal current also flows through resistor R8 and transistor Q20. The currents through transistors Q19 and Q20, and hence the voltages across resistors R9, R13 and R16, have positive temperature coefficients, which are offset by the negative temperature coefficients of the base-emitter voltages of transistors Q16–Q19.

Transistors Q15 and Q20 act as an error amplifier, the output of which is an error signal appearing at the collector of transistor Q15. The voltage at this node is clamped by transistor Q13 for current limit protection, as discussed below.

As the voltage at the feedback terminal rises, the currents flowing through the transistor/resistor string R9, Q19, Q18, Q17, R13, Q16, R16, and through resistor R8 and transistor Q20, increase in equal amounts. However, as current increases the d($V_{BE}$ voltage generated across resistor R16 causes the current ratio between transistors Q16 and Q15 to decrease, such that the collector voltage of transistor Q15, which is initially high, begins to decrease. When the voltage drop across resistor R16 reaches approximately 60 mV, the current ratio between transistors Q15 and Q16 becomes approximately 1:1. Control circuit 110 is designed to regulate at this point, which equates to a voltage of 5 volts on the feedback terminal.

The voltage at the collector of transistor Q15 drives She current gain stage formed by transistors Q12, Q9 and Q10 and bias resistors R4, R5 and R6. Transistor Q12, which receives operating current from transistors Q14 and Q4F, acts as an emitter-follower buffer. When the voltage at the feedback terminal is less than 5 volts, the collector voltage of transistor Q15 holds the base and emitter voltages of transistor Q12 high, which in turn causes output drive transistors Q9 and Q10 to sink current from the DRIVE terminal. When thus driven, output drive transistors Q9 and Q10 are capable of pulling the voltage at the DRIVE terminal down to less than 1.5 volts at a drive current level of 10 mA. This saturation voltage rises to approximately 2.0 volts at a drive current of 150 mA. Thus, an external current limiting resistor can be inserted between the DRIVE terminal of control circuit 110 and the base of the discrete PNP transistor to limit base drive current without increasing the dropout voltage of the regulator circuit. The value of this resistor can be selected as previously discussed.

For example, assuming the base-emitter voltage of the discrete PNP transistor to be 0.9 V and the regulator input voltage to be just above 5 volts (thus taking into account the voltage drop required across the emitter-collector of the PNP transistor), a 20 ohm resistor can be used to force the control circuit into saturation at a base drive current of 150 mA. For higher input voltages, the same current limit value can be achieved with a greater resistance value.

If the voltage at the feedback terminal rises above 5.0 volts, the voltage at the collector of transistor Q15 swings downward, thus reducing the drive signal provided to transistors Q9 and Q10 and Causing the control circuit to sink less base drive current from the DRIVE terminal. Control circuit 110 can be modified easily to regulate at voltages other than 5 volts. Applicants contemplate that the circuit architecture of FIG. 3 can be used to regulate positive voltages in the range from about 15 volts down to about 2.5 volts with only minor changes to the basic architecture of the circuit. This range of regulation is achieved by tailoring the I/V characteristics of transistors Q17 and Q18 and resistors R10, R11 and R13. These elements can be viewed collectively as comprising an adjustable regulation impedance component 300 (as shown in FIG. 3) which serves the purpose of setting the desired regulation voltage. To lower the regulation voltage, for example, one or both of transistors Q17 and Q18 can be removed, bias resistors R10 and R11 (which increase the voltage drop across transistor Q18) can be removed or changed, and/or the resistance value of resistor R13 can be lowered.

Regulation impedance component 300 can be simply a resistor or a combination of resistors, transistors and diodes or the like, chosen so that the voltage drop across it produces the proper desired regulation voltage. However, it should be borne in mind that, when selecting the particular elements which make up regulation impedance component 300, the temperature drift of the circuit may be affected. The selection of the combination of components should be such that the desired temperature drift of the control circuitry (typically zero) is obtained at the desired regulation voltage.

It should also be noted that, for lower regulation voltages (e.g. 2.85 volts), a start-up problem may be encountered due to the base voltage of Q12 being held low by the parasitic collector-base diode of transistor Q20, which can be pulled low through the resistor/transistor string including transistor Q19. To avoid this problem, circuitry powered from the DRIVE terminal can be incorporated to provide current to the base and emitter of transistor Q12 at start-up, thereby allowing transistors Q9 and Q10 to be turned on.

Control circuit 110 further includes a frequency compensation circuit which provides stable operation for a wide range of output capacitors (e.g., capacitors equal to or greater than 10 microfarads). The frequency compensation circuit comprises a pair of small value capacitors C2 and C3 whose values are selected to provide a roll-off of gain to well below 0 dB (e.g., to 6 db below unity), which roll-off then flattens out at higher frequencies. This allows the circuit to accommodate various amounts of output capacitance and ESR values. Capacitor C2 provides a −6 dB/octave rolloff in the gain of the amplifier output at the collector of transistor Q15. Resistor R15 combines with capacitor C2 to set the pole frequency of capacitor C2 (resistor R14 is added to balance the base current of transistor Q16 to compensate for the presence of resistor R15), and capacitor C3 provides a zero. This zero cancels the pole generated by capacitor C2 at a frequency which allows the regulator loop gain to fall well below unity. This provides phase margin to allow for a wide range of output capacitors. The zero frequency is determined by the capacitance of capacitor C3, the impedance of component 300, and the resistances of resistors R15 and R16. Appropriate values for capacitors C2 and C3 can be determined empirically. Resistor R12 has been added to provide ESD protection for capacitor C3.

A few other aspects of control circuit 110 are notable. Referring again to transistor Q4F, this transistor assists in start-up of the control circuit. At start-up, transistor Q14 does not provide current (assuming the voltage of feedback terminal FB to be low). Transistor Q4F, which is powered by the DRIVE terminal, is therefore provided to supply current to the base of output drive transistor Q10 so as to begin to drive the external PNP pass transistor. Transistor Q14 could be eliminated from the circuit. However, it provides an additional current limit foldback feature. If the output of the regulator shorts to ground, transistor Q14 will be turned off. During normal operation, this transistor provides approximately three-fourths (75 microamps) of the operating current for transistors Q10 and Q12. Thus, the output short causes the available drive current for transistor Q10 to be decreased dramatically, thus effectively folding back the internal current limit of the control circuit.

Transistor Q4G serves the purpose of a clamp and keeps transistor Q4F from saturating, which would disturb the bias levels in the other PNP transistors in the bias string. Resistor R6 is added to the output drive stage to prevent high frequency oscillations. Transistor Q13 provides an internal current limit, which works as follows. The base-emitter junction of transistor Q13 is normally reverse-biased for small currents in transistors Q9 and Q10 because the voltage across resistors R2 and R3 is higher than the voltage at the base of transistor Q12 which is connected to the emitter of transistor Q13. However, for larger currents the base-emitter junction of transistor Q13 becomes forward biased and thus turns transistor Q13 on causing current which would normally force the base of transistor Q12 high to be sent to ground through the collector of transistor Q13, thus producing clamping action. The internal current limit-value is set by the value of resistor R4. In the embodiment of FIG. 3, the internal current limit circuitry limits the current at the DRIVE terminal to approximately 170 mA.

Thermal protection is provided by transistor Q8, which draws current away from the base of transistor Q10 if a threshold temperature is exceeded. The voltage at the base of transistor Q8 has a positive temperature coefficient. The base-emitter junction of transistor Q8 has a negative temperature coefficient. Transistor Q8 turns on at a temperature of approximately 165 degrees Celsius.

Thus, a novel control circuit for a voltage regulator is provided. Persons skilled in the art will appreciate that the present invention can be practiced by other than the described embodiments, and that in actual circuits various additional components and alternative interconnections not shown in the figures may be used. The described embodiments are presented for the purposes of illustration and not of limitation, and the present invention is limited only by the claims which follow.

What is claimed is:

1. An error signal generating circuit for a voltage regulator circuit, the voltage regulator circuit having a drive terminal, a feedback terminal, and a ground terminal, the error signal generating circuit being connected to the feedback terminal and the ground terminal and having an output node, wherein the error signal generating circuit is a bandgap circuit comprising:

an error amplifier including a first PNP transistor having an emitter coupled to the feedback terminal and a collector coupled to the output node and a first NPN transistor having an emitter coupled to the ground terminal and a collector coupled to the output node, wherein the error amplifier generates an error signal at the output node comprising a differential between currents conducted by the first PNP transistor and the first NPN transistor, the error signal causing the voltage regulator circuit to regulate an output voltage substantially at a desired voltage point;

a rectifying junction coupled with a base-emitter circuit of the first NPN transistor in a serial loop which includes a first resistor coupled between an emitter of the first NPN transistor and a first terminal of the rectifying junction, a second terminal of the rectifying junction being coupled to the feedback terminal through at least one impedance element so that the first NPN transistor and the rectifying junction conduct currents in a ratio which varies responsive to changes in potential difference between the feedback terminal and the ground terminal;

a second PNP transistor having a base coupled to a base of the first PNP transistor and an emitter coupled to the feedback terminal, an emitter-collector circuit of the second PNP transistor being coupled in series with at least one impedance element between the feedback and ground terminals, wherein the first and second PNP transistors draw currents from the feedback terminal in a substantially fixed ratio, the level of the currents varying together in response to changes in potential difference between the feedback terminal and the ground terminal;

wherein the error signal generated by the error amplifier varies in response to changes in potential difference between the feedback terminal and the ground terminal, and wherein impedance of the at least one impedance element through which the rectifying junction is coupled to the feedback terminal, and impedance of the at least one impedance element with which an emitter-collector circuit of the second PNP transistor is coupled in series between the feedback and ground terminals, contributes to the setting of the desired regulating voltage point of the voltage regulator.

2. The error signal generating circuit of claim 1, wherein the rectifying junction is a base-emitter junction of a second NPN transistor, a collector of the second NPN transistor being coupled to the feedback terminal through at least one impedance element so that the first and second NPN transistors conduct current in a ratio which varies responsive to changes in potential difference between the feedback terminal and the ground terminal.

3. The error signal generating circuit of claim 1, wherein the collector of the second NPN transistor is coupled to the feedback terminal by at least one impedance element which also is in series with a collector-emitter circuit of said second PNP transistor between the feedback and ground terminals.

4. The error signal generating circuit of claim 3, further comprising a first capacitor coupled between a base of the first NPN transistor and the output terminal and a second capacitor coupled between the base of the first NPN transistor and the feedback terminal, the first capacitor providing a rolloff in the gain of the error signal generating circuit, and the second capacitor providing a zero which cancels a pole generated by the first capacitor at a frequency which allows regulator gain to fall well below unity.

5. The error signal generating circuit of claim 4, further comprising a second resistor coupled to the base of the first NPN transistor which in combination with the capacitance of the first capacitor sets the pole frequency of the first capacitor.

6. The error signal generating circuit of claim 5, further comprising a third resistor coupled between a base and a collector of the second NPN transistor to balance current in the error generating circuit.

7. The error signal generating circuit of claim 6, wherein the zero frequency of the second capacitor is determined by the capacitance of the second capacitor, the impedance of the at least one impedance element and the resistances of the first and second resistors.

8. The error signal generating circuit of claim 4, further comprising a resistor coupled in series with the second capacitor between the base of the first NPN transistor and the feedback terminal, the resistor providing electrostatic discharge protection for the second capacitor.

9. A circuit for generating an error signal indicative of a difference between a monitored voltage and a reference voltage, the circuit comprising:

a first input adapted for (1) receiving an operating voltage for the circuit; and (2) monitoring the monitored voltage;

first and second PNP transistors each having an emitter coupled to the first input and a base respectively coupled together in a current-mirror configuration for providing operating current for the circuit;

a first NPN transistor having an emitter coupled to ground and a collector commonly coupled to a collector of the first PNP transistor to form an output that generates the error signal;

a second NPN transistor having a base commonly coupled to a base of the first NPN transistor and having an emitter coupled to ground through a first resistor, said resistor having a voltage drop for regulating the currents through the first and second NPN transistors so as to maintain the monitored voltage substantially at the reference voltage; and an impedance coupled in series with a collector of the second PNP transistor and a collector of the second NPN transistor for substantially establishing the regulation voltage of the circuit.

* * * * *

UNITED STATES PATENT AND TRADEMARK OFFICE

CERTIFICATE OF CORRECTION

PATENT NO. : 5,485,109

DATED : January 16, 1996

INVENTOR(S) : Robert C. Dobkin, Carl T. Nelson, Dennis P. O'Neill

It is certified that error appears in the above-indentified patent and that said Letters Patent is hereby corrected as shown below:

| Column | Line | Correction |
|---|---|---|
| Cover page Abstract Section | 3 | Change "base-drive" to -- base drive --. |
| 3 | 13 | Insert -- , -- after "$V_{out}$". |
| 3 | 58 | Change "achieved-with" to -- achieved with --. |
| 4 | 53 | Change "transistors-have" to -- transistors have --. |
| 4 | 66 | Change "d($V_{BE}$" to -- d($V_{BE}$) --. |
| 5 | 26 | Change "resistor" to -- resistors --. |
| 5 | 45 | Change "d($V_{BE}$" to -- d($V_{BE}$) --. |
| 5 | 54 | Change "She" to -- the --. |
| 6 | 18 | Change "Causing" to -- causing --. |
| 7 | 40 | Insert -- , -- after "Q13 on". |

UNITED STATES PATENT AND TRADEMARK OFFICE

CERTIFICATE OF CORRECTION

PATENT NO. : 5,485,109

DATED : January 16, 1996

INVENTOR(S) : Robert C. Dobkin, Carl T. Nelson, Dennis P. O'Neill

It is certified that error appears in the above-indentified patent and that said Letters Patent is hereby corrected as shown below:

| Column | Line | Correction |
|---|---|---|
| 7 | 44 | Change "limit-value" to -- limit value --. |
| 8 | 57 | Change "claim 1" to -- claim 2 --. |
| 8 | 67 | Change "rolloff" to -- roll-off --. |

Signed and Sealed this

Twenty-eighth Day of December, 1999

Attest:

Q. TODD DICKINSON

Attesting Officer

Acting Commissioner of Patents and Trademarks